(12) United States Patent
Kamata (10) Patent No.: US 8,686,750 B2
(45) Date of Patent: Apr. 1, 2014

(54) METHOD FOR EVALUATING SEMICONDUCTOR DEVICE

(75) Inventor: Koichiro Kamata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 411 days.

(21) Appl. No.: 13/101,387

(22) Filed: May 5, 2011

(65) Prior Publication Data

US 2011/0279144 A1 Nov. 17, 2011

(30) Foreign Application Priority Data

May 13, 2010 (JP) .................................. 2010-111158

(51) Int. Cl.
*G01R 31/26* (2006.01)

(52) U.S. Cl.
USPC ................... 324/762.09; 324/762.01; 438/17

(58) Field of Classification Search
None
See application file for complete search history.

(56) References Cited

U.S. PATENT DOCUMENTS

| | | | |
|---|---|---|---|
| 5,600,578 A * | 2/1997 | Fang et al. | 703/14 |
| 5,731,856 A | 3/1998 | Kim et al. | |
| 5,744,864 A | 4/1998 | Cillessen et al. | |
| 5,999,011 A * | 12/1999 | Chu et al. | 324/762.09 |
| 6,151,561 A * | 11/2000 | Maeda | 702/58 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,873,932 B1 * | 3/2005 | Kim | 702/182 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Minh N Tang
(74) *Attorney, Agent, or Firm* — Eric J. Robinson; Robinson Intellectual Property Law Office, P.C.

(57) ABSTRACT

To provide a simple method for evaluating reliability of a transistor, a simple test which correlates with a bias-temperature stress test (BT test) is performed instead of the BT test. Specifically, a gate current value is measured in the state where a voltage lower than the threshold voltage of an n-channel transistor whose channel region includes an oxide semiconductor is applied between a gate and a source of the transistor and a potential applied to a drain is higher than a potential applied to the gate. The evaluation of the gate current value can be simply performed compared to the case where the BT test is performed; for example, it takes short time to measure the gate current value. That is, reliability of a semiconductor device including the transistor can be easily evaluated.

6 Claims, 6 Drawing Sheets

(56) References Cited

U.S. PATENT DOCUMENTS

| | | | |
|---|---|---|---|
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0295041 | A1 | 11/2010 | Kumomi et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2001-274210 | | 10/2001 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165527 | | 6/2006 |
| JP | 2006-165528 | | 6/2006 |
| JP | 2006-165529 | | 6/2006 |
| WO | WO-2004/114391 | | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M at al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09: SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 film,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,",SID Digest '08: SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.
Nowatari.H et al., "60.2: Intermediate Connector With Suppressed Voltage Loss for white Tandem OLEDS,", SID Digest '09: SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02: Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID DIgest '09: SID Internation Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09: SID International Syposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09: Proceedings of the 16th International Display Workshops, 2009, pp. 689-692.
Park.J et al., "Amorphous Indium-Gallium-Zinc Oxide TFTs and Their Application for Large Size AMOLED,",AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09: SID International Symposium Digest of Technical Papers, May 31, 2009, pp. 1110-1112.
Ohara.H et al., "21.3:4.0 in. QVGA AMOLED Display Using In—Ga—Zn—Oxide TFTs With a Novel Passivation Layer,", SID Digest '09: SID International Symposium Digest of Technical Papers, May 31, 2009, pp. 284-287.
Miyasaka.M, "Suftla Flexible Microelectronics on Their Way to Business,", SID Digest '07: SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Application,", SID Digest '09: SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09: SID International Symposium Digest of Technical Papers, May 31, 2009, pp. 395-398.
Lee.H et al., "Current Status of, Challenges to, and Perspective View of AM-OLED ,", IDW '06: Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H at al., "Polymer-Stabilized Liquid Crystal Blue Phases,", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—Bo

(56) References Cited

OTHER PUBLICATIONS

Systems [A; Fe, Ga, or Al; B: Mg, Mn, Fe, Ni, Cu, or Zn] at Temperatures Over 1000 °C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee at al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M at al., "Mechanism of Electrical Conductivity of Transparent InGaZnO4,", Phys Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and Examples,", J. Non-Cryst. Solids (Journal of Non-Crystalline Solids), 1996, vol. 198-20, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Teechnol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

METHOD FOR EVALUATING SEMICONDUCTOR DEVICE

BACKGROUND OF THE INVENTION

1. Field of the Invention

The present invention relates to a method for evaluating reliability of a semiconductor device including a transistor.

2. Description of the Related Art

In recent years, metal oxides having semiconductor characteristics (hereinafter referred to as oxide semiconductors) have attracted attention. For example, a thin film transistor which includes a semiconductor layer using an amorphous oxide (an oxide semiconductor) whose electron carrier concentration is less than $10^{18}/cm^3$ is disclosed in the Patent Documents 1 to 3.

When a transistor is applied to various products, the transistor preferably has high reliability. From this reason, characteristics of a transistor under various environments are needed to be recognized. For example, as a test for recognizing the characteristics of a transistor, a bias-temperature stress test (hereinafter referred to as a BT test) is known. Temperature, a bias condition, and the like are considered as test conditions of a BT test (see Patent Document 4).

REFERENCE

[Patent Document 1] Japanese Published Patent Application No. 2006-165527
[Patent Document 2] Japanese Published Patent Application No. 2006-165528
[Patent Document 3] Japanese Published Patent Application No. 2006-165529
[Patent Document 4] Japanese Published Patent Application No. 2001-274210

SUMMARY OF THE INVENTION

Note that several hours to several tens of hours are required for measurement by the above described BT test.

In view of the above, an object of one embodiment of the present invention is to provide a method for evaluating reliability of a semiconductor device including a transistor by a simple method.

The present inventor has found that there is a correlation between a gate current value of an n-channel transistor whose channel region includes an oxide semiconductor under a specific condition, and a result of a BT test of the transistor under the same condition. Specifically, the present inventor has found that there is a correlation between a gate current value and a result of a BT test which are in the same state where a voltage lower than the threshold voltage of the transistor is applied between a gate and a source of the transistor and a potential applied to a drain is higher than a potential applied to the gate. In other words, the present inventor has found that a gate current value in the state where the transistor is in an off state (a state where a channel region is not formed) and an electric field is generated from the drain of the transistor to the gate of the transistor correlates with a result of a BT test performed under the same state. Note that the gate current refers to a current generated in the gate.

As will be described in detail, when a gate current value is measured under the above condition, a current (transient current) is generated in the gate even after the gate is electrically connected to a wiring which supplies a fixed potential. Note that the gate current value decreases with time. Here, from what the transient current results is considered. For example, when the transient current results only from a leakage from the gate to a source (a gate leakage), a gate current generated by the gate leakage should be in a steady state because a fixed potential is applied to the gate and the source under the above condition. In other words, the gate current value should be constant and does not vary with time. However, in reality, the gate current value decreases with time. That is, it can be considered that there is a factor other than the gate leakage which causes the generation of the transient current. The present inventor has considered that the transient current results from accumulation of positive charges in an oxide semiconductor or at the interface between an oxide semiconductor and a gate insulating film. In other words, under the above condition, negative charges are accumulated with time at the interface between the gate and the gate insulating film through the gate insulating film in accordance with the accumulation of positive charges with time in the oxide semiconductor or at the interface between the oxide semiconductor and the gate insulating film. Therefore, it is considered that the transient current is generated even after the gate is electrically connected to the wiring which supplies a fixed potential.

On the other hand, when the BT test is performed under the above condition, deterioration such as a negative shift of a drain current (Id)-gate voltage (Vg) curve and an increase of an off state current value is generated in some cases. Note that a degree of the deterioration depends on a sample condition, a test condition, and the like. It can be considered that the deterioration is caused by the accumulation of positive charges in the oxide semiconductor or at the interface between the oxide semiconductor and the gate insulating film, and by trapping of part of the positive charges in the oxide semiconductor or at the interface between the oxide semiconductor and the gate insulating film. That is, it can be considered that when part of the accumulated positive charges are trapped in the oxide semiconductor or at the interface between the oxide semiconductor and the gate insulating film under the above condition, the negative shift of the drain current (Id)-gate voltage (Vg) curve and the increase of an off state current value occur, for example.

The present inventor has considered that both of them (the transient current generated in the gate and the deterioration due to the BT test) depend on the same phenomenon (the accumulation of positive charges in the oxide semiconductor or at the interface between the oxide semiconductor and the gate insulating film). In fact, a correlation was found between these two as a result of the evaluation.

The present inventor has found that there is a correlation between a gate current value and a result of a BT test which are in the same state where a voltage lower than the threshold voltage of an n-channel transistor whose channel region includes an oxide semiconductor is applied between a gate and a source of the transistor and a potential applied to a drain is higher than a potential applied to the gate. The evaluation of the gate current value can be simply performed compared to the case where the BT test is performed; for example, it takes short time to measure the gate current value. In other words, reliability of a semiconductor device including the transistor can be easily evaluated by the measurement of the gate current value.

DETAILED DESCRIPTION OF THE INVENTION

First, structural examples of a transistor to be a sample will be described with reference to FIGS. 1A to 1D.

FIGS. 1A to 1D are cross-sectional views each illustrating the structural examples of the transistor. A transistor 211 illustrated in FIG. 1A includes a gate layer 221 provided over a substrate 220 having an insulating surface, a gate insulating film 222 provided over the gate layer 221, an oxide semiconductor layer 223 provided over the gate insulating film 222, and a source layer 224a and a drain layer 224b provided over the oxide semiconductor layer 223.

As described above, the transistor 211 illustrated in FIG. 1A includes the oxide semiconductor layer 223 as a semiconductor layer where a channel region is formed. As an oxide semiconductor used for the oxide semiconductor layer 223, any of the following can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are three-component metal oxides; an In—Ga—O-based oxide semiconductor, an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor which are two-component metal oxides; and an In—O-based oxide semiconductor, a Sn—O-based oxide semiconductor, and a Zn—O-based oxide semiconductor which are single-component metal oxides. Further, $SiO_2$ may be contained in the above oxide semiconductors. Here, for example, the In—Ga—Zn—O-based oxide semiconductor means an oxide containing at least In, Ga, and Zn, and the composition ratio of the elements is not particularly limited. The In—Ga—Zn—O-based oxide semiconductor may contain an element other than In, Ga, and Zn.

Figure 1A:
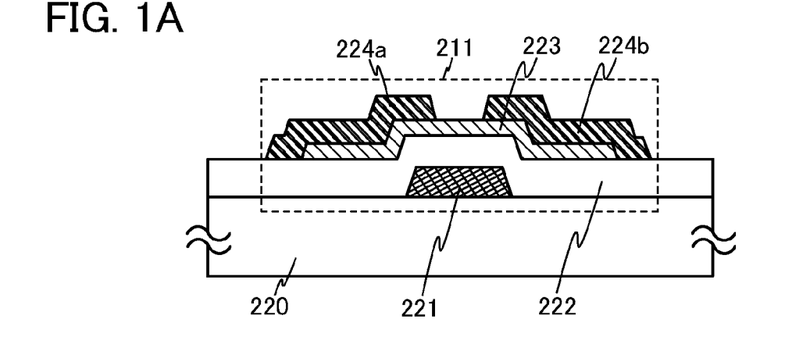
FIGS. 1A to 1D are cross-sectional views each illustrating a structural example of a transistor.

For the oxide semiconductor layer 223, a thin film represented by the chemical formula, $InMO_3(ZnO)_m$ (m>0), can be used. Here, M represents one or more metal elements selected from Ga, Al, Mn, and Co. For example, M may be Ga, Ga and Al, Ga and Mn, Ga and Co, or the like.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=1.5:1 to 15:1 in an atomic ratio ($In_2O_3$:ZnO=3:4 to 15:2 in a molar ratio). For example, in a target used for formation of an In—Zn—O-based oxide semiconductor which has an atomic ratio of In:Zn:O=X:Y:Z, the relation of Z>1.5X+Y is satisfied.

As the substrate 220 having an insulating surface, a glass substrate of barium borosilicate glass, aluminoborosilicate glass, or the like can be used, for example. Note that a substrate formed of an insulator such as a ceramic substrate, a quartz substrate, or a sapphire substrate may be used for the substrate 220, instead of the glass substrate. Alternatively, crystallized glass or the like can be used.

In the transistor 211, an insulating film serving as a base film may be provided between the substrate 220 and the gate layer 221. The base film has a function of preventing diffusion of an impurity element from the substrate, and can be formed to have a single-layer structure or a stacked-layer structure using one or more of a silicon nitride film, a silicon oxide film, a silicon nitride oxide film, and a silicon oxynitride film.

The gate layer 221 can be formed to have a single-layer structure or a stacked-layer structure using a metal material such as molybdenum (Mo), titanium (Ti), chromium (Cr), tantalum (Ta), tungsten (W), aluminum (Al), copper (Cu), neodymium (Nd), or scandium (Sc), or an alloy material including any of these as a main component.

The gate insulating film 222 can be formed by a plasma CVD method, a sputtering method, or the like as a single-layer structure or a stacked-layer structure of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer. For example, by a plasma CVD method, a silicon nitride layer ($SiN_y$ (y >0)) with a thickness of 50 nm or more and 200 nm or less is formed as a first gate insulating film, and a silicon oxide layer ($SiO_x$ (x >0)) with a thickness of 5 nm or more and 300 nm or less can be formed as a second gate insulating film over the first gate insulating film.

As a conductive film used for the source layer 224a and the drain layer 224b, for example, an element selected from aluminum (Al), chromium (Cr), copper (Cu), tantalum (Ta), titanium (Ti), molybdenum (Mo), and tungsten (W), an alloy containing any of these elements as a component, an alloy film combining any of these elements, or the like can be used. Alternatively, a structure may be employed in which a high-melting-point metal layer of titanium (Ti), molybdenum (Mo), tungsten (W), or the like is stacked over and/or below a metal layer of aluminum (Al), copper (Cu), or the like. In addition, heat resistance can be improved by using an aluminum (Al) material to which an element (such as Si, Nd, or Sc) for preventing generation of a hillock or a whisker in an aluminum (Al) film is added.

Further alternatively, the conductive film to be the source layer 224a and the drain layer 224b (including a wiring layer formed in the same layer as the source layer 224a and the drain layer 224b) may be formed of a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$–ZnO), or any of these metal oxide materials containing silicon oxide can be used.

The transistors disclosed in this specification are not limited to the structure illustrated in FIG. 1A. For example, structures illustrated in FIGS. 1B to 1D can be applied to these transistors.

Figure 1B:
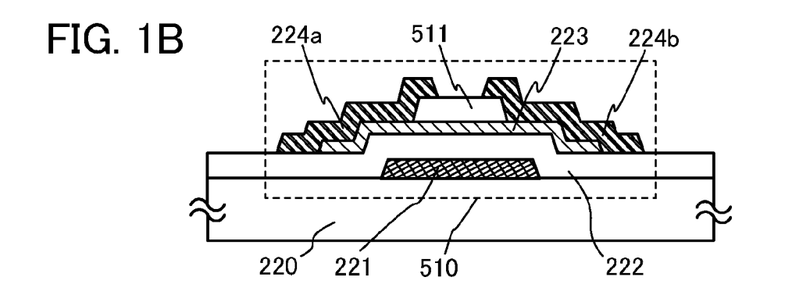

A transistor 510 illustrated in FIG. 1B is one of bottom-gate transistors referred to as a channel-protective (also referred to as a channel-stop) transistor.

The transistor 510 includes the gate layer 221, the gate insulating film 222, the oxide semiconductor layer 223, an insulating layer 511 functioning as a channel protective layer that covers a channel formation region of the oxide semiconductor layer 223, the source layer 224a, and the drain layer 224b, which are formed over the substrate 220 having an insulating surface.

As the insulating layer 511, an insulator such as silicon oxide, silicon nitride, silicon oxynitride, silicon nitride oxide, aluminum oxide, or tantalum oxide can be used. A stacked-layer structure of these materials can also be used.

Figure 1C:
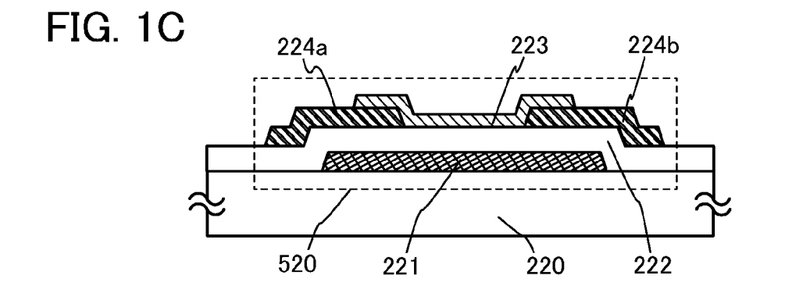

A transistor 520 illustrated in FIG. 1C is a bottom-gate transistor. The transistor 520 includes the gate layer 221, the gate insulating film 222, the source layer 224a, the drain layer 224b, and the oxide semiconductor layer 223, which are formed over the substrate 220 having an insulating surface.

In the transistor 520, the gate insulating film 222 is provided on and in contact with the substrate 220 and the gate layer 221, and the source layer 224a and the drain layer 224b are provided on and in contact with the gate insulating film 222. The oxide semiconductor layer 223 is provided over the gate insulating film 222, the source layer 224a, and the drain layer 224b.

Figure 1D:
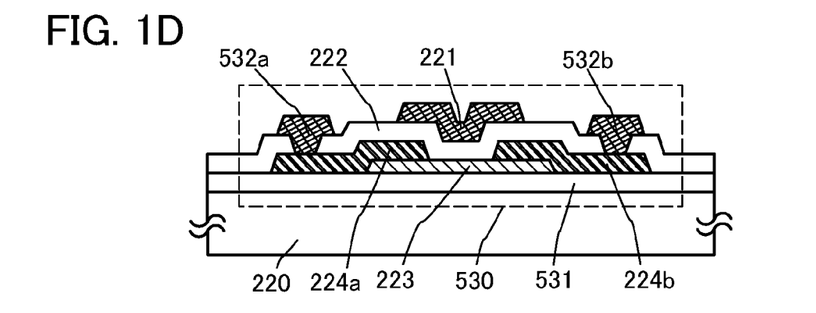

A transistor 530 illustrated in FIG. 1D is one of top-gate transistors. The transistor 530 includes an insulating layer 531, the oxide semiconductor layer 223, the source layer 224a, the drain layer 224b, the gate insulating film 222, and the gate layer 221, which are formed over the substrate 220 having an insulating surface. A wiring layer 532a and a wiring layer 532b are provided in contact with and electrically connected to the source layer 224a and the drain layer 224b respectively.

As the insulating layer 531, an insulator such as silicon oxide, silicon nitride, silicon oxynitride, silicon nitride oxide, aluminum oxide, or tantalum oxide can be used. A stacked-layer structure of these materials can also be used.

As the wiring layers 532a and 532b, an element selected from aluminum (Al), copper (Cu), titanium (Ti), tantalum (Ta), tungsten (W), molybdenum (Mo), chromium (Cr), neodymium (Nd), and scandium (Sc); an alloy containing any of these elements; or a nitride containing any of these elements can be applied. A stacked-layer structure of these materials can also be used.

EXAMPLE 1

In this example, measurement results of variations in gate current values with time and results of a BT test are shown. The states of these results, which are the same, are as follows: a voltage lower than the threshold voltage of a transistor whose channel formation region includes an oxide semiconductor is applied between a gate and a source of the transistor; and a potential applied to a drain is higher than a potential applied to the gate. Further, in this example, the measurement of gate current values and the BT test were performed under five temperature conditions on two kinds of transistors having gate insulating films with different thicknesses. In other words, 20 samples were prepared for the measurement. Specific conditions of the measurement in this example are shown in Table 1. In Table 1, Samples 1 to 10 were used for the measurement of variations in the gate current values with time and Samples 11 to 20 were used for the BT test.

TABLE 1

| | Thickness of Gate Insulating film (nm) | Measurement Temperature (° C.) |
|---|---|---|
| Samples 1, 11 | 30 | 25 |
| Samples 2, 12 | 30 | 40 |
| Samples 3, 13 | 30 | 85 |
| Samples 4, 14 | 30 | 125 |
| Samples 5, 15 | 30 | 150 |
| Samples 6, 16 | 100 | 25 |
| Samples 7, 17 | 100 | 40 |
| Samples 8, 18 | 100 | 85 |
| Samples 9, 19 | 100 | 125 |
| Samples 10, 20 | 100 | 150 |

Note that transistors having the structure illustrated in FIG. 1A are used for the measurement in this example. In addition, channel length L and channel width W of each of the Samples 1 to 20 are 10 μm and 1 m respectively. Manufacturing steps of the transistors are described below in detail.

First, a tungsten film with a thickness of 100 nm was formed over a glass substrate by a sputtering method. Then, a gate layer with a thickness of 100 nm was formed by a photolithography method and an etching method.

Next, a gate insulating film was formed over the substrate and the gate layer by a plasma CVD method. Note that as shown in Table 1, the thicknesses of the gate insulating films of the Samples 1 to 5 and 11 to 15 are 30 nm respectively and the Samples 6 to 10 and 16 to 20 are 100 nm respectively.

Next, an oxide semiconductor film with a thickness of 20 nm was formed over the gate insulating film by a sputtering method. Here, a target used for formation of the oxide semiconductor film by a sputtering method is, for example, an oxide target containing $In_2O_3$, $Ga_2O_3$, and ZnO at a composition ratio of 1:1:1 [mol], so that an In—Ga—Zn—O film was formed. Film formation was performed while heating the substrate at 200° C. As the other conditions of the film formation, the pressure was 0.6 Pa, the direct current (DC) power supply was 5 kW, and the atmosphere was a mixed atmosphere of oxygen and argon (the gas flow ratio of oxygen and argon was 1:1).

Subsequently, the oxide semiconductor film was subjected to heat treatment at 650° C. in a nitrogen atmosphere for 6 minutes, using a gas rapid thermal anneal (GRTA) apparatus.

Next, an oxide semiconductor layer with a thickness of 20 nm was formed by a photolithography method and an etching method.

Then, a titanium film with a thickness of 100 nm, an aluminum film with a thickness of 200 nm, and a titanium film with a thickness of 100 nm were stacked and formed over the gate insulating film and the oxide semiconductor layer by a sputtering method. A source layer and a drain layer which were formed of a stacked layer of a titanium film, an aluminum film, and a titanium film and had a thickness of 400 nm were formed by a photolithography method and an etching method.

Through the above steps, the transistors were completed. Note that an interlayer insulating film was further formed over each of the transistors, which were used in the measurement of this example. Specifically, a silicon oxide film with a thickness of 300 nm was formed over each of the transistors by a sputtering method, following the above steps. Moreover, an acrylic film with a thickness of 1.5 μm was formed over the silicon oxide film by a spin coating method.

The measurement results of this example are shown below. In this example, the measurement of variations in the gate current values with time was performed in the state where a potential of −2.0 V was applied to the gate of each of the transistors and a potential of 0 V was applied to the source and the drain of each of the transistors. In addition, drain current (Id)-gate voltage (Vg) characteristics were evaluated in the same state after the BT test was performed for 600 seconds.

Figure 2:
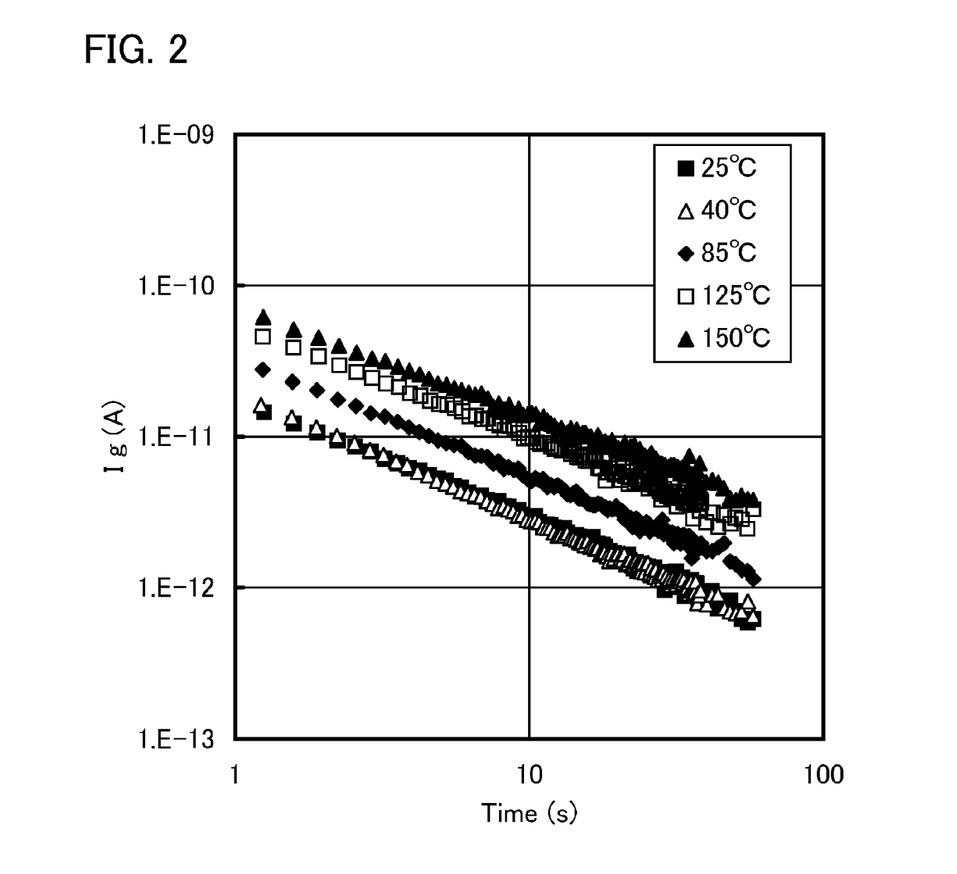
FIG. 2 is a graph showing variations in gate current values with time.
Figure 3:
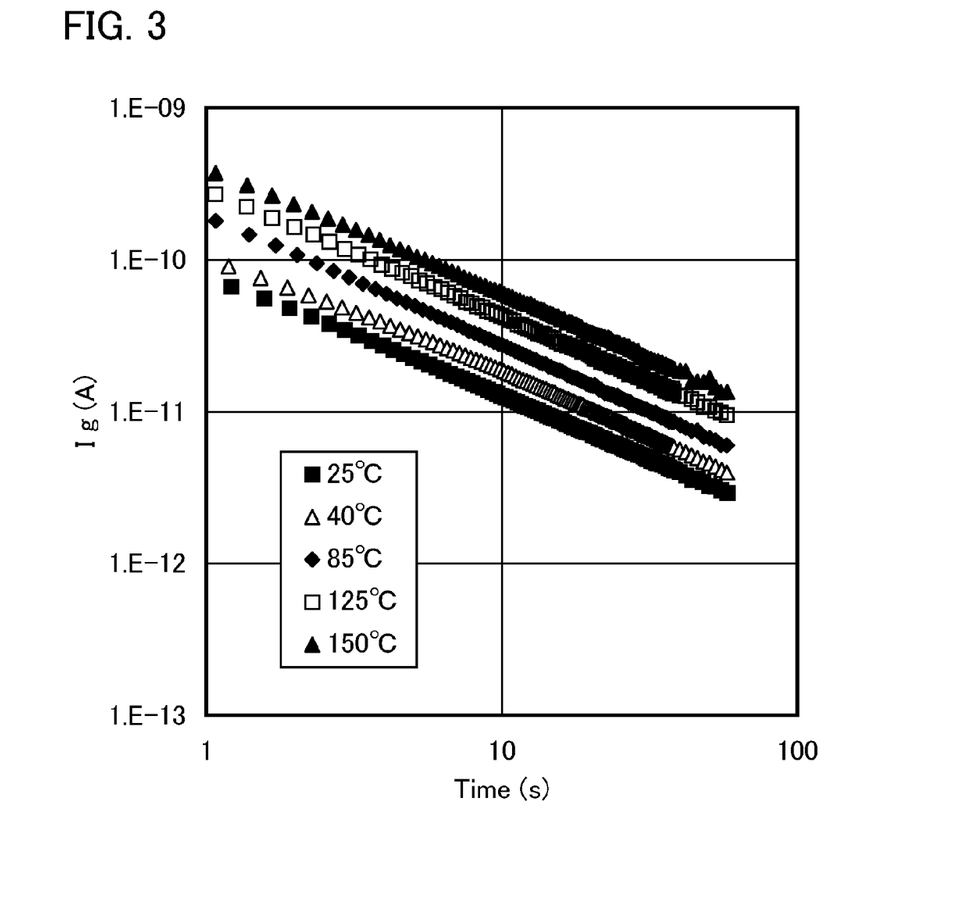
FIG. 3 is a graph showing variations in gate current values with time.

FIG. 2 is a graph showing variations in the gate current values of the Samples 1 to 5 with time. FIG. 3 is a graph showing variations in the gate current values of the Samples 6 to 10 with time. The graphs in FIG. 2 and FIG. 3 show that the gate current values are increased in accordance with an increase in the measurement temperature. Further, the gate current values of each of the transistors including the gate insulating film with a thickness of 100 nm is greater than the gate current values of each of the transistors including the gate insulating film with a thickness of 30 nm.

Figure 4:
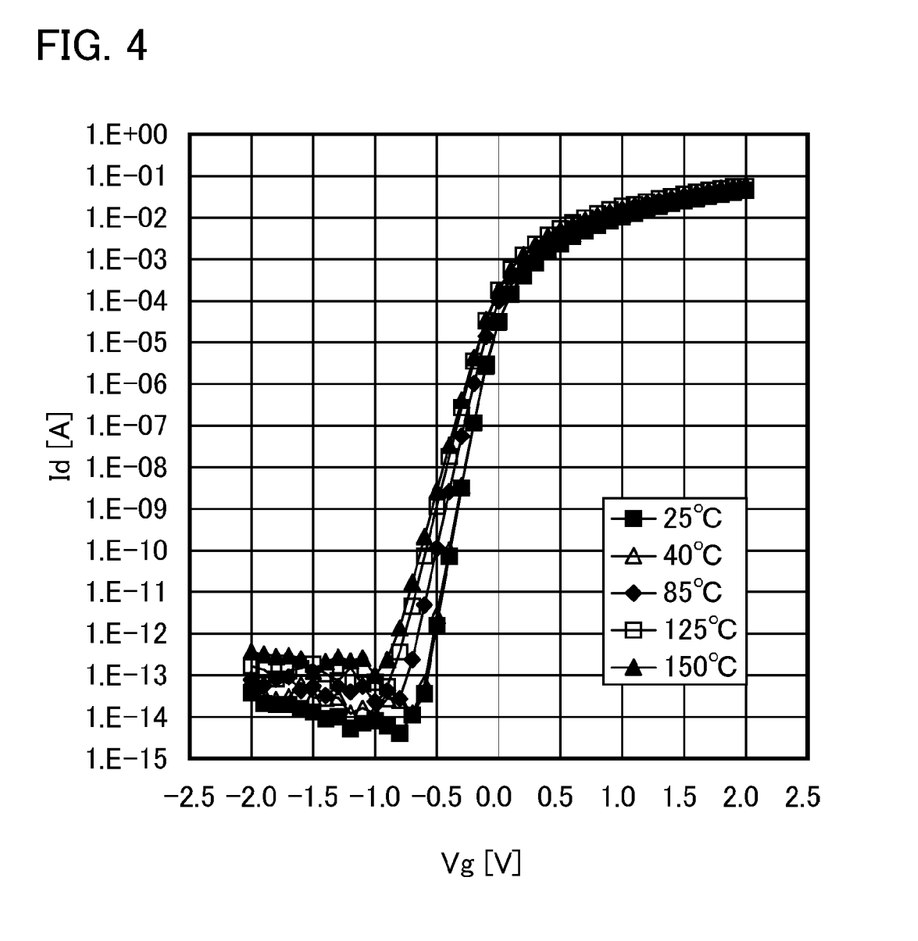
FIG. 4 is a graph showing drain current (Id)-gate voltage (Vg) characteristics of transistors.
Figure 5:
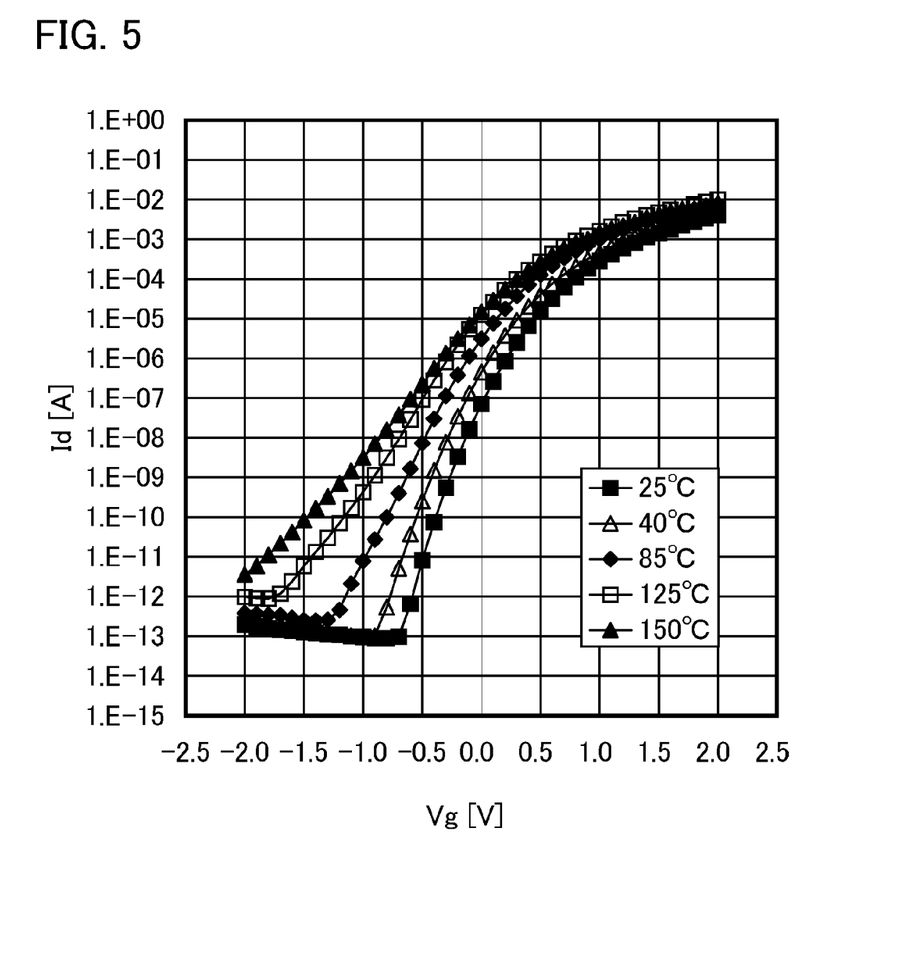
FIG. 5 is a graph showing drain current (Id)-gate voltage (Vg) characteristics of transistors.

FIG. 4 is a graph showing drain current (Id)-gate voltage (Vg) characteristics of the Samples 11 to 15 after the BT test was performed. FIG. 5 is a graph showing drain current (Id)-gate voltage (Vg) characteristics of the Samples 16 to 20 after the BT test was performed. The graphs in FIG. 4 and FIG. 5 show that deterioration due to the BT test (a negative shift of a drain current (Id)-gate voltage (Vg) curve and an increase in the off current) is more remarkable in high temperature tests. Further, deterioration, due to the BT test, of each of the transistors including the gate insulating film with a thickness of 100 nm is more remarkable than that of each of the transistors including the gate insulating film with a thickness of 30 nm.

Figure 6:
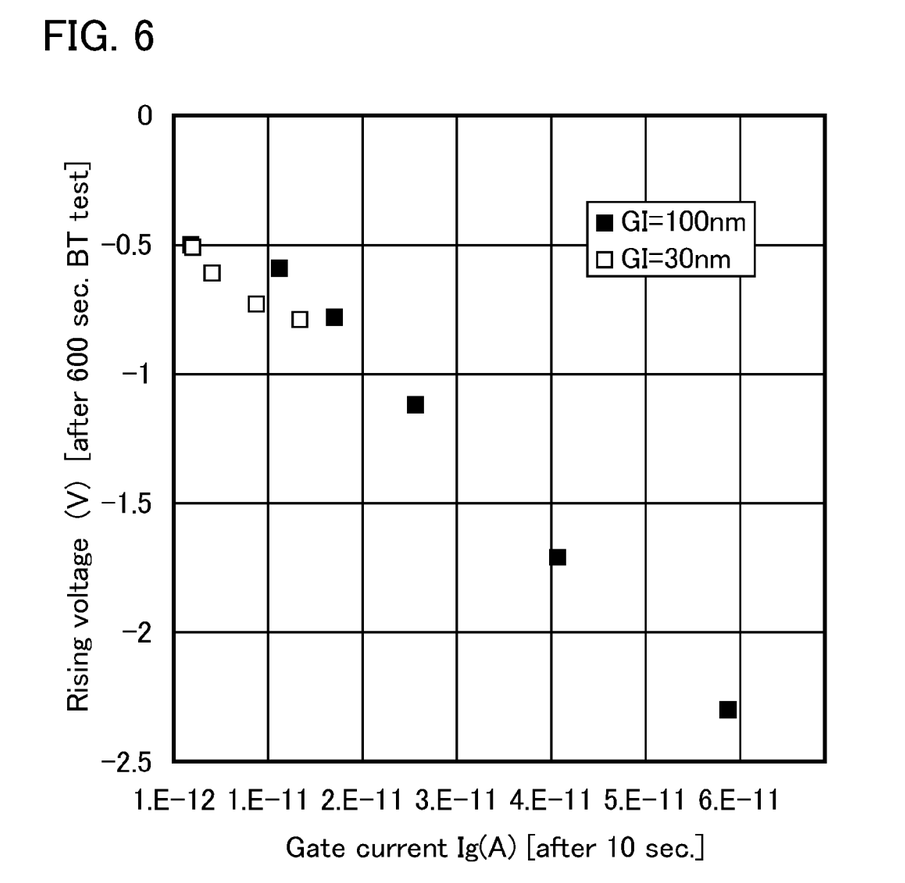
FIG. 6 is a graph showing evaluation of a relation between gate current values and deterioration due to a BT test.

FIG. 6 is a graph showing evaluation of a relation between the gate current values and the deterioration due to the BT test, based on the above described measurement results. Specifically, in FIG. 6, the horizontal axis indicates the gate current values of each of the Samples 1 to 10 at 10 seconds after each of the measurements is started under the above conditions. The vertical axis indicates the rising voltage of the drain current (Id)-gate voltage (Vg) curve after the BT test was performed on the samples under the conditions where thickness of the gate insulating film and measurement temperature are the same as that of the above conditions. Note that a "rising voltage" in this specification refers to a voltage value when a current value is increased by an order of magnitude from a reference value. Here, the reference value is a current value of a transistor in an off state. FIG. 6 shows that the value of the rising voltage is reduced in accordance with an increase of the gate current values. In other words, it is found that a degree of deterioration due to the BT test can be observed by the gate current values.

This application is based on Japanese Patent Application serial no. 2010-111158 filed with Japan Patent Office on May 13, 2010, the entire contents of which are hereby incorporated by reference.

What is claimed is:

1. A method for evaluating a semiconductor device, comprising the steps of:
   measuring a gate current value in a state where a voltage lower than a threshold voltage of an n-channel transistor whose channel region comprises an oxide semiconductor is applied between a gate and a source of the transistor, and a potential applied to a drain is higher than a potential applied to the gate; and
   evaluating reliability of the semiconductor device comprising the transistor, using the gate current value.

2. The method for evaluating a semiconductor device, according to claim 1, wherein the voltage between the gate and the source of the transistor is negative.

3. The method for evaluating a semiconductor device, according to claim 1, wherein the potential applied to the drain is zero.

4. A method for evaluating a semiconductor device, comprising the steps of:
   measuring a variation in a gate current value with time in a state where a voltage lower than a threshold voltage of an n-channel transistor whose channel region comprises an oxide semiconductor is applied between a gate and a source of the transistor, and a potential applied to a drain is higher than a potential applied to the gate; and
   evaluating reliability of the semiconductor device, comprising the transistor, using the variation in the gate current value with time.

5. The method for evaluating a semiconductor device, according to claim 4, wherein the voltage between the gate and the source of the transistor is negative.

6. The method for evaluating a semiconductor device, according to claim 4, wherein the potential applied to the drain is zero.

* * * * *